US007274267B2

(12) United States Patent
Saitou et al.

(10) Patent No.: US 7,274,267 B2
(45) Date of Patent: Sep. 25, 2007

(54) BALUN

(75) Inventors: Akira Saitou, Tokyo (JP); Toshimasa Yamazaki, Tokyo (JP); Koichi Watanabe, Tokyo (JP)

(73) Assignee: YKC Corporation, Tokyo (JP)

( * ) Notice: Subject to any disclaimer, the term of this patent is extended or adjusted under 35 U.S.C. 154(b) by 186 days.

(21) Appl. No.: 10/549,672

(22) PCT Filed: Mar. 19, 2003

(86) PCT No.: PCT/JP03/03340

§ 371 (c)(1),
(2), (4) Date: Sep. 19, 2005

(87) PCT Pub. No.: WO2004/084339

PCT Pub. Date: Sep. 30, 2004

(65) Prior Publication Data

US 2006/0175680 A1 Aug. 10, 2006

(51) Int. Cl.
*H03H 7/42* (2006.01)
*H01P 3/08* (2006.01)

(52) U.S. Cl. ........................................ 333/26; 333/238

(58) Field of Classification Search ................. 333/25, 333/26, 109, 110, 111, 112, 113, 115, 116, 333/238

See application file for complete search history.

(56) References Cited

U.S. PATENT DOCUMENTS 5,304,959 A * 4/1994 Wisherd et al. ............... 333/26
6,294,965 B1 * 9/2001 Merrill et al. ................ 333/26
6,982,609 B1 * 1/2006 McKay et al. ................ 333/25

FOREIGN PATENT DOCUMENTS

JP 10-163715 6/1998
SU 915140 3/1982

* cited by examiner

*Primary Examiner*—Dean Takaoka
(74) *Attorney, Agent, or Firm*—Wenderoth, Lind & Ponack, L.L.P.

(57) ABSTRACT

A balun in which the phase shift may be reduced significantly is disclosed. The balun has three lines, i.e. a first line b, a second line a and a third line c, arranged in parallel with the ground surface. The second line a and the third line c are arranged at the same height from the ground surface GC, the longitudinal length of each respective one of the first line b, second line a and third line c are specified to be equal to a quarter (¼) of the wavelength at the central frequency in the working band, and the capacitance Ca between the second line a and the ground surface GC is specified to be equal to the capacitance Cab between the second line a and the first line b. Furthermore, the distance h3 between the center of each respective one of the second line a and third line c in the height direction and the ground surface GC located closer to each respective one of the second line a and third line c is specified to be longer than the distance h2 between the center of the first line b in the height direction and the center of each respective one of the second line a and third line c in the height direction, or the permittivity of a dielectric D3 is specified to be less than that of a dielectric D2.

6 Claims, 8 Drawing Sheets

BALUN

TECHNICAL FIELD

The present invention relates to a balun having three lines arranged in parallel with the ground surface.

BACKGROUND

For the high-speed LSI for the recent wireless LAN, such as Bluetooth, the balanced-mode signals are in most cases produced in order to increase the signal noise margin.

As the wireless circuit generally employs an unbalanced circuit, however, the balun (balanced unbalanced conversion circuit) constitutes an essential element for performing this conversion.

The balun may comprise two branch circuits, that is, a ¼-wavelength line and a ¾-wavelength line.

When the balun includes the ¼-wavelength line and ¾-wavelegth line, however, they have a different line length. Thus, even if a frequency can have a phase of 180 degrees with regard to the central frequency, the phase shift may be increased if the frequency is shifted within a band.

In view of the above fact, it is an object of the present invention to provide a balun in which the phase shift can be reduced significantly.

SUMMARY OF THE INVENTION

In order to solve the problems described above, the inventors of the present invention have studied the problems extensively and earnestly, and have discovered that the problems can be solved by providing a balanced circuit that includes three lines each having the line length equal to ¼of the wavelength at the central frequency in the working band. The present invention is thus based on the above discovery.

Specifically, the balun of the present invention is one that has three lines, that is, a first line, a second line and a third line, arranged in parallel with the ground surface, wherein the second line and the third line are arranged at the same height from the ground surface, the longitudinal length of each respective one of the first line, second line and third line is specified to a quarter of the central frequency in the working band, and the capacitance between the second line and the ground surface is specified to be equal to the capacitance between the second line and the first line.

According to the present invention, the distance between the center of each respective one of the second line and third line in the direction of the height and the ground surface located closer to the second line and third line is specified to be larger than the distance between the center of first line in the direction of the height and the center of each respective one of the second line and third line in the direction of the height. As one alternative, the permittivity of a dielectric between the plane formed by the center of each respective one of the second line and third line in the direction of the height may be specified to be less than the permittivity of a dialectic between the plane formed by the center of the first line in the direction of the height and the plane formed by the center of each respective one of the second line and third line in the direction of the height.

As a further alternative, the length of each respective one of the second line and third line in the direction of the width may be specified to be equal, the second line and third line may be arranged symmetrically with regard to the plane formed by the center of the first line in the direction of the width, one terminal of the first line being assumed as an input terminal for unbalanced-mode signals may be connected to one terminal of the third line as such input terminal, the other terminal of the first line and one terminal of the second line may be connected to the ground surface, respectively, and the other terminal of the second line and the other terminal of the third line may be assumed as output terminals for balanced-mode signals, with the impedance of the input terminal for unbalanced-mode signals and the impedance of the output terminal for balanced-mode signals being specified to satisfy the following relationship defined below:

$$(Ca+Cac)/\epsilon_0=\epsilon_r^{1/2}\times Z_{air}/(Z_{in}\times Z_{out})^{1/2}$$

where Ca is the capacitance (C) between the second line and the ground surface, Cac is the capacitance (C) between the second line and the third line, $\epsilon_0$ is the permittivity in the vacuum, $\epsilon_r$ is the specific permittivity, $Z_{air}$ is the characteristic impedance (Ω) in the vacuum, $Z_{in}$ is the impedance (Ω) of the input terminal for unbalanced-mode signals, and $Z_{out}$ is the impedance (Ω) of the output terminal for balanced-mode signals.

FIG. 1 is a sectional view illustrating one embodiment of the balun according to the present invention, and FIG. 2 is a top view illustrating one embodiment of the balun according to the present invention.

According to the present invention, the longitudinal length of each respective one of the first length a, second length a and third length c is specified to a quarter (¼) of the wavelength of the central frequency in the working band, the second line a and third line c are arranged at the same height from the ground surface GC, and the capacitance Ca between the second line a and ground surface GC is set to be equal to the capacitance Cab between the second line a and first line b (hereinafter, this equality will sometimes be referred to as "Ca=Cab").

In the balun of the present invention, it is preferred that the distance between the center of each respective one of the second line a and third line c in the direction of the height and the ground surface GC located closer to the second line a and third line c (which will sometimes be referred to as "h3") should be specified to be longer than the distance between the first line b in the direction of the height and the distance of each respective one of the second line a and third line c in the direction of the height (which will sometimes be referred to as "h2"). In the following description, it should be noted that the distance between the center of the first line b in the direction of the height and the ground surface GC located closer to the first line b will sometimes be referred to as "h1".

In the balun of the present invention, furthermore, it is preferred that instead of being h2 <h3, the permittivity ϵ 3 of a dialectic (which will sometimes be referred to as "D3") between the plane formed by the center of each respective one of the second line a and third line c in the direction of the height and the ground surface GC located closer to the second line a and third line c should be specified to be less than the permittivity ϵ 2 of a dialectic (which will sometimes be referred to as "D2") between the plane formed by the center of the first line b in the direction of the height and the plane formed by the center of each respective one of the second line a and third line c in the direction of the height (which will sometimes be referred to as "$\epsilon 3<\epsilon 2$"). In the following description, it should be noted that the dialectic between the plane formed by the center of the first line b and the ground surface located closer to the first line b will sometimes be referred to as "D1".

In the balun of the present invention in which h2<h3 is given, the dielectric having the relative permittivity $\epsilon_r$ is included so that the permittivity $\epsilon_r$ is equal for all of the dielectric 1, dielectric 2 and dielectric 3.

The following describes the results of the electromagnetic field analysis that was performed using the device simulator for the capacitance Ca between the second line a and ground surface GC and the capacitance Cab between the second line a and first line b.

Initially, for h2=h3=2 micrometers being given, the capacitance Ca and the capacitance Cab have been examined to determine how those capacitances will change as the interval Sac between the second line a and third line c is varied. The results are given in FIG. 3.

It may be seen from FIG. 3 that Ca>Cab is satisfied for all of the intervals Sac that have been varied, but Ca=Cab is not satisfied.

Accordingly, it may be appreciated that at least Ca=Cab can be satisfied if any of the following conditions is satisfied.

a) ha<h3

If this condition is satisfied, the incremental amount of the capacitance Ca will become greater than that of the capacitance Cab if the interval Sac is increased. If Ca<Cab is true when the interval Sac is initially small, enlarging the interval Sac gradually will cause Ca versus Cab to change like Ca<Cab, Ca=Cab, and Ca>Cab. Thus, the interval Sac that satisfies Ca=Cab can be estimated.

FIG. 4 shows how the capacitance Ca versus the capacitance Cab will change if the interval Sac is changed when h2=1.5 micrometers and h3=2 micrometers are given. It may be seen from FIG. 4 that Ca=Cab can be satisfied when the interval Sac is about 10.3 micrometers.

b) $\epsilon 3<\epsilon 2$

If this condition is satisfied, the interval Sac that satisfies Cab=Cab is available even if h2=h3.

If $\epsilon 3<\epsilon 2$, the medium will become isotropic no longer in its strict sense of the word although it has little effect. The balun can thus be constructed as is the case with h2<h3.

In the present invention, furthermore, it is preferred that the length of the second line a in the direction of the width (which will sometimes be referred to as "Wa") should be specified to be equal to the length of the third line c in the direction of the width and shorter than the length of the first line b in the direction of the width (which will sometimes be referred to as "Wb"). It is also preferred that the thickness of each respective one of the first line b, second line a and third line c (which will sometimes be referred to as "t") should be equally the same.

It is preferred that the second line a and third line c should be arranged symmetrically with regard to the line formed by the center of the first line b in the direction of the width and its extension. Preferably, one terminal of the first line b should be assumed as the input terminal for unbalanced-mode signals which is connected to one terminal of the third line c, the other terminal of the first line b and one terminal of the second line a should be connected to the ground surface GC, respectively, and the other terminal of the second line a and the other terminal of the third line c should be assumed as the output terminal for balanced-mode signals.

It is preferred that the length of each respective one of the second line a and third line c in the direction of the width (Wa) and the interval between the second line a and third line c in the direction of the width (which will sometimes be referred to as "Sac") should be chosen as appropriate in order to satisfy the following relationship as well as the condition specified by Ca=Cab.

$$(Ca+Cac)/\epsilon_0=\epsilon_r^{1/2}\times Z_{air}/(Z_{in}\times Z_{out})^{1/2}$$

where Ca is the capacitance (C) between the second line a and the ground surface GC, Cac is the capacitance (C) between the second line a and the third line c, $\epsilon_0$ is the permittivity in the vacuum, $\epsilon_r$ is the relative permittivity, $Z_{air}$ is the characteristic impedance (Ω) in the vacuum, $Z_{in}$ is the impedance (Ω) of the input terminal for unbalanced-mode signals, and $Z_{out}$ is the impedance (Ω) of the output terminal for balanced-mode signals.

The following explains the process of deriving the above relationship, in which it is assumed that there is no loss since the line conductor loss and the dielectric loss are usually negligible.

The Y matrix (6 rows×6 columns) for the three-line balun shown in FIG. 2 in which the line length is equal to a quarter of the wavelength at the central frequency in the working band may be given as follows:

$$Y = 1\Big/ku\begin{pmatrix} \omega C, & -\omega C(1-u^2)^{1/2} \\ -\omega C(1-u^2)^{1/2}, & \omega C \end{pmatrix}$$

where, ω refers to the frequency and u=j×tan (KL) (K is the phase constant in the dielectric and L is the line length).

C is the C matrix for the 3 lines, that is, $$C = \begin{pmatrix} Ca+Cab+Cac, & -Cab, & -Cac \\ -Cab, & Cb+2Cab, & -Cab \\ -Cac, & -Cab, & Ca+Cab+Cac \end{pmatrix}$$

where, Cb refers to the capacitance (C) between the first line and ground surface.

As the line length L is specified to be equal to a quarter of the wavelength at the central frequency in the working band, 1/u can approximate to zero (0), and $(1-u^2)^{1/2}/u$ can approximate to −j.

Accordingly, the Y matrix can be arranged as follows:

$$Y = j\omega/k\begin{pmatrix} 0, & C \\ C, & 0 \end{pmatrix}$$

-continued $$Y = j\omega / k_z \begin{pmatrix} 0, & 0, & 0, & Ca + Cab + Cac, & -Cab, & -Cac \\ 0, & 0, & 0, & -Cab, & Cb + 2Cab, & -Cab \\ 0, & 0, & 0, & -Cac, & -Cab, & Ca + Cab + Cac \\ Ca + Cab + Cac, & -Cab, & Cac, & 0, & 0, & 0 \\ -Cab, & Cb + 2Cab, & -Cab, & 0, & 0, & 0 \\ -Cac, & -Cab, & Ca + Cab + Cac, & 0, & 0, & 0 \end{pmatrix}$$

In FIG. 2 and in the following description, it is assumed that the six terminals are designated as u terminal, v terminal, w terminal, x terminal, y terminal and z terminal, respectively, and the input terminal 1 ($P_{in}$ 1) is electrically connected to the v terminal of the first line and to the w terminal of the third line, and the y terminal of the first line and the u terminal of the second line are connected to the ground surface, respectively, with the x terminal of the second line being electrically connected to the output terminal ($P_{out}$ 2) and the z terminal of the third line being electrically connected to the output terminal 3 ($P_{out}$ 3).

Under the above assumption, the following equation will hold true:

$Vu$ (voltage at $u$ terminal)=$Vy$ (voltage at $y$ terminal) =0

$Vv$ (voltage at $v$ terminal)=$Vw$ (voltage at $w$ terminal)=$V1$ (voltage at input terminal 1

$J1$ (current through input terminal 1)=$Jv$ (current through $v$ terminal)+$Jw$ (current through $w$ terminal)

$Vx$ (voltage at $x$ terminal)=$V2$ (voltage at output terminal 2)

$Jx$ (current through $x$ terminal)=$V2$ (voltage at output terminal 2)

$Vz$ (voltage at $z$ terminal)=$V3$ (voltage at output terminal 3)

$Jz$ (current through $z$ terminal)=$J3$ (current through output terminal 3)

Accordingly, the following equation will hold true:

$J1$ (current through input terminal 1) has the following relationship:

$$J1 = Jv + Jw$$

$$J1 = j\omega\{-Cab \times V2 - Cab \times V3 - Cac \times V2 + (Ca + Cab + Cac)V3\}/k_z$$

$$J1 = j\omega\{-(Cab + Cac) \times V2 + (Ca + Cac)\ V3\}/k_z$$

Accordingly, the Y matrix for the three terminals may be given in terms of the following equation:

$$Y = j\omega / k_z \begin{pmatrix} 0, & -(Cab + Cac), & Ca + Cac \\ -(Cab + Cac), & 0, & 0 \\ Ca + Cac, & 0, & 0 \end{pmatrix}$$

Now, consider the case where the above Y matrix satisfies the conditions specified by the balun. Then, the lossless balun can satisfy the following condition, considering the central symmetry:

$$S_{11} = 0$$

$$S_{21} = -S_{31} = 2^{1/2} \times \exp(j\alpha)/2$$

$$S_{22} - S_{32} = S_{33} - S_{23} = 0$$

As the balun is lossless, the following equation will hold true:

$$|S_{21}|^2 + |S_{22}|^{1/2} + |S_{23}|^2 = 1$$

$$S_{ij} = S_{ji}\ i, j = 1, 2, 3$$

$$\begin{pmatrix} Ju \\ Jv \\ Jw \\ J2 \\ Jy \\ J3 \end{pmatrix} = j\omega / k_z \begin{pmatrix} 0, & 0, & 0, & Ca + Cab + Cac, & -Cab, & -Cac \\ 0, & 0, & 0, & -Cab, & Cb + 2Cab, & -Cab \\ 0, & 0, & 0, & -Cac, & -Cab, & Ca + Cab + Cac \\ Ca + Cab + Cac, & -Cab, & Cac, & 0, & 0, & 0 \\ -Cab, & Cb + 2Cab, & -Cab, & 0, & 0, & 0 \\ -Cac, & -Cab, & Ca + Cab + Cac, & 0, & 0, & 0 \end{pmatrix}$$

$$\begin{pmatrix} Ju \\ Jv \\ Jw \\ J2 \\ Jy \\ J3 \end{pmatrix} = j\omega / k_z \begin{pmatrix} (Ca + Cab + Cac)V2 - CacV3 \\ -CabV2 - CabV3 \\ -CacV2 + (Ca + Cab + Cac)V3 \\ -(Cab + Cac)V1 \\ (Cb + Cab)V1 \\ (Ca + Cac)V1 \end{pmatrix}$$

Therefore, the S matrix may be given as follows:

$$S=\begin{pmatrix} 0, & 2^{-1/2}\times\exp(j\alpha), & -2^{-1/2}\times\exp(j\alpha) \\ 2^{-1/2}\times\exp(j\alpha), & S_{22}, & S_{22} \\ -2^{-1/2}\times\exp(j\alpha), & S_{22}, & S_{22} \end{pmatrix}$$

where, $|S_{22}|^2=\frac{1}{4}$, thus $S_{22}=\exp(j\beta)/2$.

$$S=\begin{pmatrix} 0, & 2^{-1/2}\times\exp(j\alpha), & -2^{-1/2}\times\exp(j\alpha) \\ 2^{-1/2}\times\exp(j\alpha), & 1/2\times\exp(j\beta), & 1/2\times\exp(j\beta) \\ -2^{-1/2}\times\exp(j\alpha), & 1/2\times\exp(j\beta), & 1/2\times\exp(j\beta) \end{pmatrix}$$

The above equation assumes that all of the input and output terminals have the reference impedance, and if the above S matrix is converted into the Y matrix with the input/output terminal impedance being $Z_{in}$, $Z_{out}/2$, the resulting Y matrix Yb will be obtained as follows:

$$Yb=\begin{pmatrix} Yb_{11}, & Yb_{12}, & Yb_{12} \\ Yb_{12}, & Yb_{22}, & Yb_{23} \\ Yb_{12}, & Yb_{23}, & Yb_{22} \end{pmatrix}$$

where, $$Yb_{11}=-(1+\exp(2j\alpha)/\{Z_{in}(-1+\exp(2j\alpha))\}$$

$$Yb_{12}=2\exp(j\alpha)/\{Z_{in}\times Z_{out})^{1/2}(-1+\exp(2j\alpha))\}$$

$$Yb_{22}=-2(1+\exp(j(2\alpha+\beta)))/\{Z_{out}(-1+\exp(2j\alpha)\ (1+\exp(j\beta))\}$$

$$Yb_{23}=2(\exp(j2\alpha)+\exp(j\beta))/\{Z_{out}(-1+\exp(2j\alpha))(1+\exp(j\beta))\}$$

The Y matrix for the three terminals may be expressed in terms of the following equation:

$$Y=j\omega/k_z\begin{pmatrix} 0, & -(Cab+Cac), & Ca+Cac \\ -(Cab+Cac), & 0, & 0 \\ Ca+Cac, & 0, & 0 \end{pmatrix}$$

In order that the above equation will be equal to the Y matrix of the input/output terminal impedance $Z_{in}$, $Z_{out}/2$, it is required that $\exp(2\alpha j)=-1$, $\exp(\beta j)=1$ exist. For $\alpha=\pi/2$, $\beta=\pi$, Yb may be expressed as follows:

$$Yb=\begin{pmatrix} 0, & -j/(Z_{in}\times Z_{out})^{1/2}, & j/(Z_{in}\times Z_{out})^{1/2} \\ -j/(Z_{in}\times Z_{out})^{1/2}, & 0, & 0 \\ j/(Z_{in}\times Z_{out})^{1/2}, & 0, & 0 \end{pmatrix}$$

The balun can be obtained if the construction of the C matrix is designed so that it can satisfy the following equations by comparing Y and Yb:

$$\omega(Cab+Cac)=k_z/(Z_{in}\times Z_{out})^{1/2}$$

$$\omega(Ca+Cac)=k_z/(Z_{in}\times Z_{out})^{1/2}$$

That is, $$\omega(Cab+Cac)=\omega(Ca+Cac)=k_z/(Z_{in}Z_{out})^{1/2}$$

Accordingly, the required condition can be expressed by the two equations given below:

$$Ca=Cab$$

$$vp(Ca+Cac)=1/(Z_{in}\times Z_{out})^{1/2}$$

As the relative permeability is approximately 1 for the ordinary metals, the phase velocity Vp may be expressed as follows, using $Z_{air}=(\mu_0/\epsilon_0)^{1/2}=120\pi$.

$$vp=1/(\epsilon\mu)^{1/2}$$

$$vp=1/(\epsilon_r\epsilon_0\mu_0)^{1/2}$$

$$vp=1/(\epsilon_0\times Z_{air}\times\epsilon_r^{1/2})$$

Accordingly, $$(Ca+Cac)=1/vp(Z_{in}\times Z_{out})^{1/2}$$

$$(Ca+Cac)=\epsilon_0\times Z_{air}\times\epsilon_r^{1/2}/(Z_{in}\times Z_{out})^{1/2}$$

From the above, $$(Ca+Cac)/\epsilon_0=\epsilon_r^{1/2}\times Z_{air}/(Z_{in}\times Z_{out})^{1/2}$$

According to the present invention, the balun that provides any desired input/output impedance can be constructed by choosing the appropriate length of each respective one of the second line and third line in the direction of the width and the appropriate interval Sac between the second line a and third line c, even if the particular input/output impedance is specified for the balun.

FIG. 5 presents the values of the interval Sac, capacitance (Ca+Cab), and input/output impedance $(Z_{in}\times Z_{out})^{1/2}$ that will satisfy the Ca=Cab condition by varying the length Wa of each respective one of the second line a and third line c in the direction of the width. It should be noted that the length Wb of the first line b in the direction of the width is fixed to 16 micrometers.

It may become apparent from FIG. 5 that the balun that provides any desired input/output impedance can be constructed by choosing the appropriate length Wa in the direction of the width and the appropriate interval Sac, even if the particular input/output impedance is specified for the balun.

In the strip line-type balun according to the present invention, it should be noted that the property will remain unchanged if the absolute dimensions are varied because the aspect ratio can be the same. Thus, the same property can be obtained even if the aspect ratio is increased or decreased.

BEST MODES OF EMBODYING THE INVENTION

Several preferred embodiments of the present invention are now described below. It should be understood, however, that the present invention is not restricted to those embodiments, which may be modified in numerous ways without departing from the spirit and scope of the invention as defined in the appended claims.

Embodiment 1

In the first embodiment being described here, the balun of the present invention employs the construction in which it has the band of 2.45 GHz, the input impedance of 50 Ω and the output impedance of 100 Ω. Then, the balun was examined to check the performance.

Since $(Z_{in}\times Z_{out})^{1/2}$=70.7 Ω is given, h2=1.5 micrometers, h3=2 micrometers, Wa=3.35 micrometers, Sab=0.17 micrometers, Sac=8.96 micrometers, and Wb=16 micrometers are provided.

The line has the length of about 15.5 mm that generally corresponds to ¼wavelength for the band of 2.45 GHz and permittivity of 3.6.

It should be noted that as the line has the length of 100 micrometers for the actual print circuit board, the above parameters may be multiplied by a factor of 100 such that h2=150 micrometers, h3=200 micrometers, Wa=335 micrometers, Sab=17 micrometers, Sac=896 micrometers, and Wb=1600 micrometers.

Figure 1:
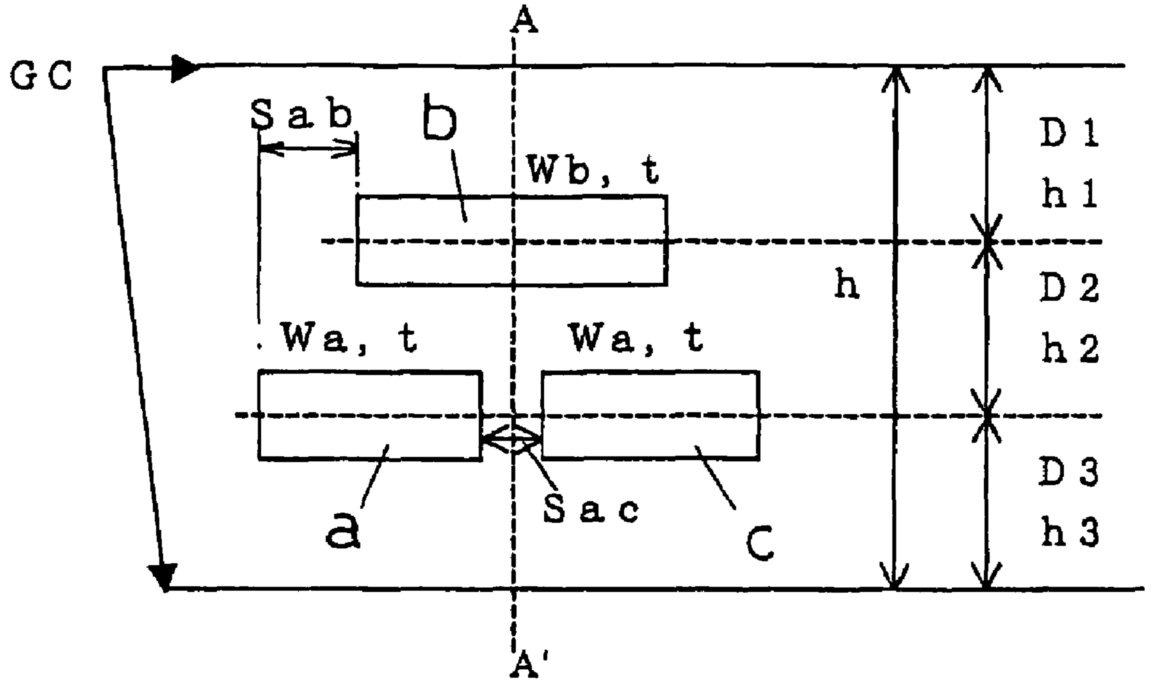
FIG. 1 is a sectional view illustrating one example of the balun according to the present invention, in which a refers to a second line, b refers to a first line, c refers to a third line, GC refers to a ground surface, Wa refers to the length of each respective one of the second line a and third line c in the direction of the width, Wb refers to the length of the first line b in the direction of the width, t refers to the thickness of the first line b, second line a and third line c in the direction of the height, Sac refers to the interval between the second line a and third line c in the direction of the width, and Sab refers to the location of one end of the second line a in the direction of the width when one end of the first line b is given as a reference; it should be noted that when Sab is positive, the one end of second line is situated outside the one end of the first line b, and when Sab is negative, the one end of the second line is situated inside the one end of the first line; the second line a and third line c are located symmetrically with regard to the line AA'; generally, h means the distance with regard to the ground surface GC; specifically, h1 refers to the distance between the center of the first line b in the direction of the height and the ground surface GC located closer to the first line b, h2 refers to the distance between the center of the first line b in the direction of the height and the center of each respective one of the second line a and third line c in the direction of the height, and h3 refers to the distance between the center of each respective one of the second line a and third line c in the direction of the height and the ground surface GC closer to the second line a and third line c; D1 refers to a dielectric 1, D2 refers to a dielectric 2 and D3 refers to a dielectric 3.
Figure 2:
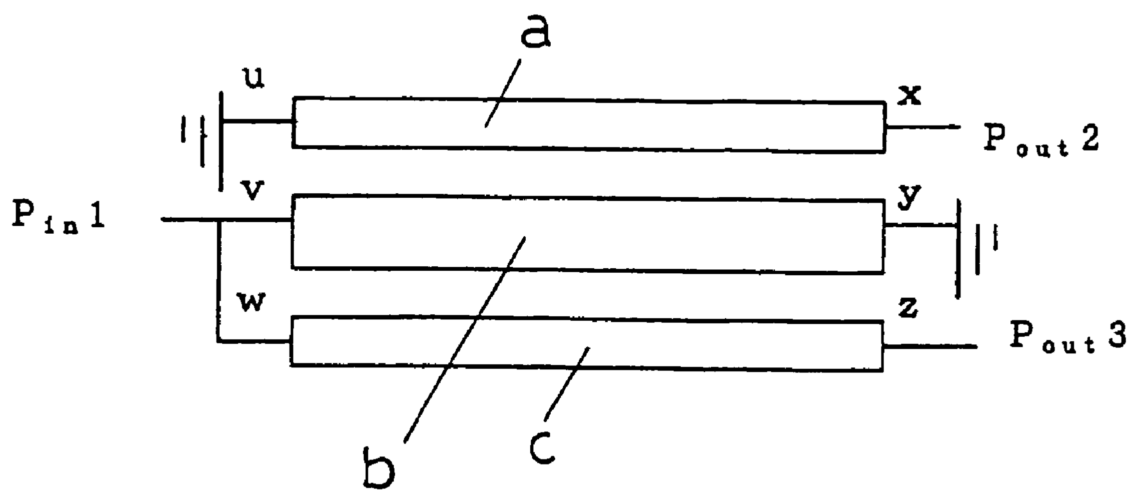
FIG. 2 is a top view illustrating one example of the equivalent circuit diagram for the balun according to the present invention, in which $P_{in}1$ refers to an input terminal 1, $P_{out}2$ refers to an output terminal 2, and $P_{out}3$ refers to an output terminal 3, with u, v, w, x, y, and z representing six terminals; it should be noted that the longitudinal length of each respective one of the first line b, second line a and third line c is specified to be equal to one quarter of the wavelength at the central frequency in the working band.
Figure 3:
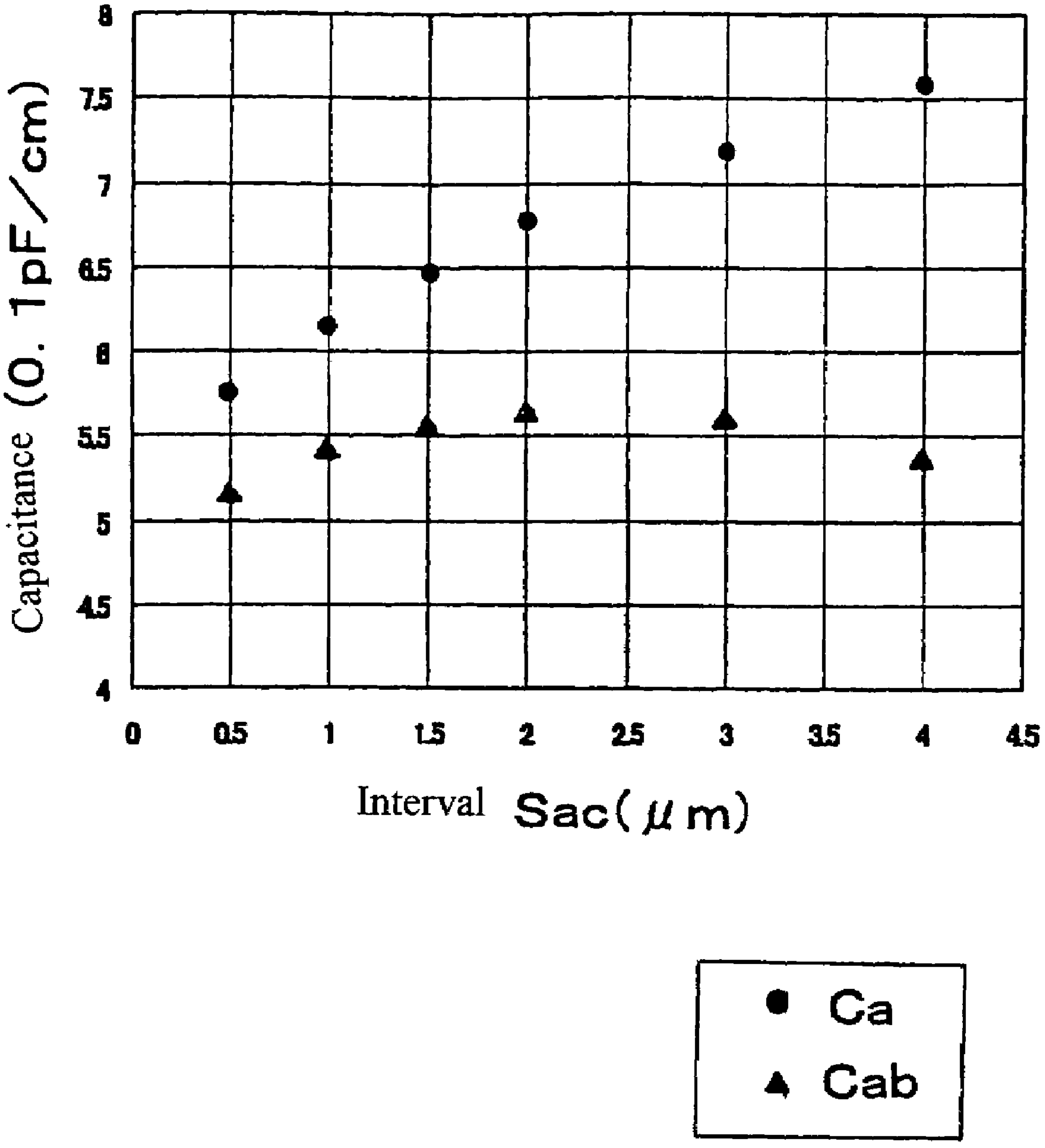
FIG. 3 is a graph diagram that shows how the capacitance will be changed as the distance between the second line and third line is varied when h2=h3.
Figure 4:
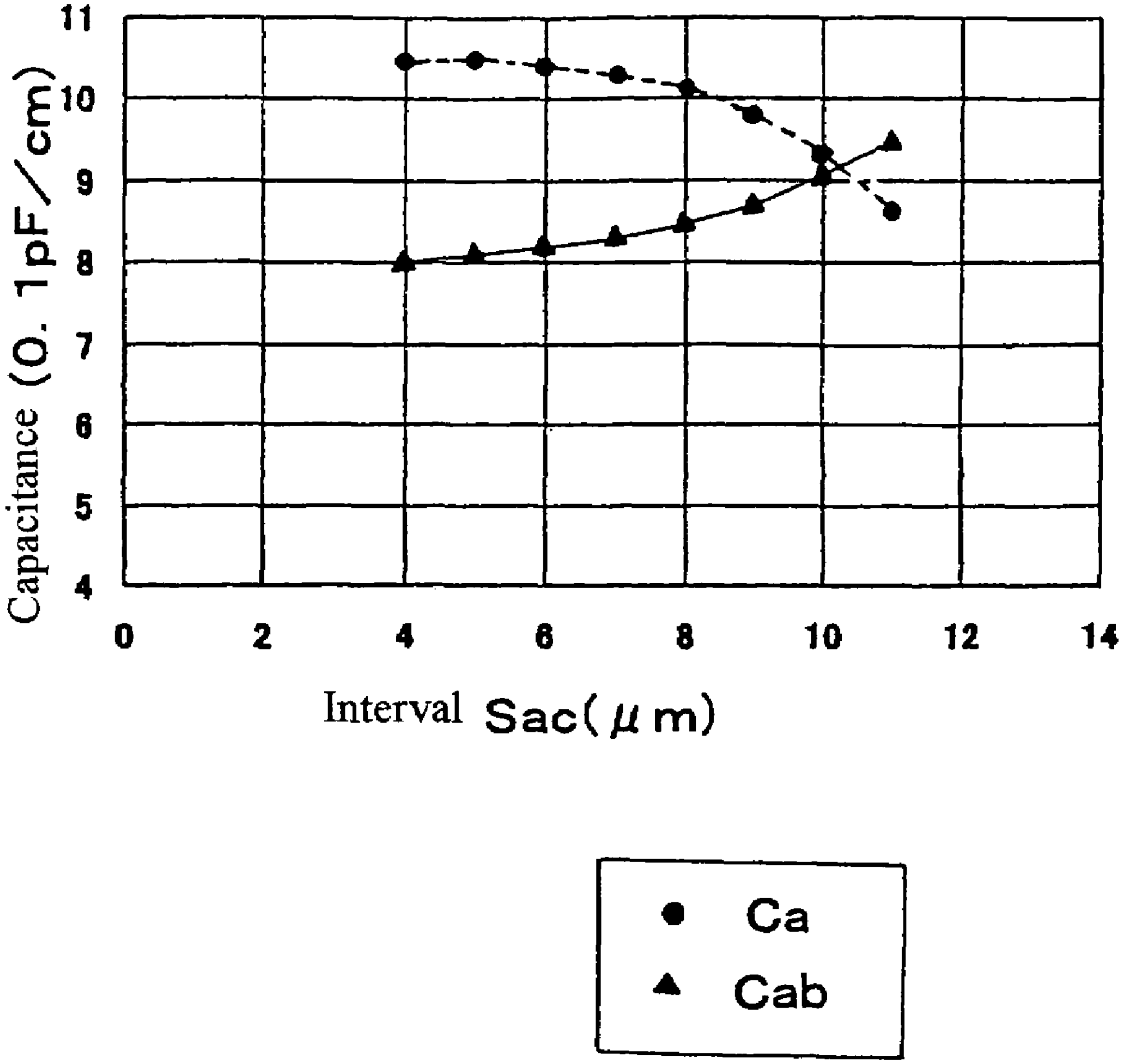
FIG. 4 is a graph diagram that shows how the capacitance will be changed as the distance between the second line and third line is varied when h2<h3.
Figure 5:
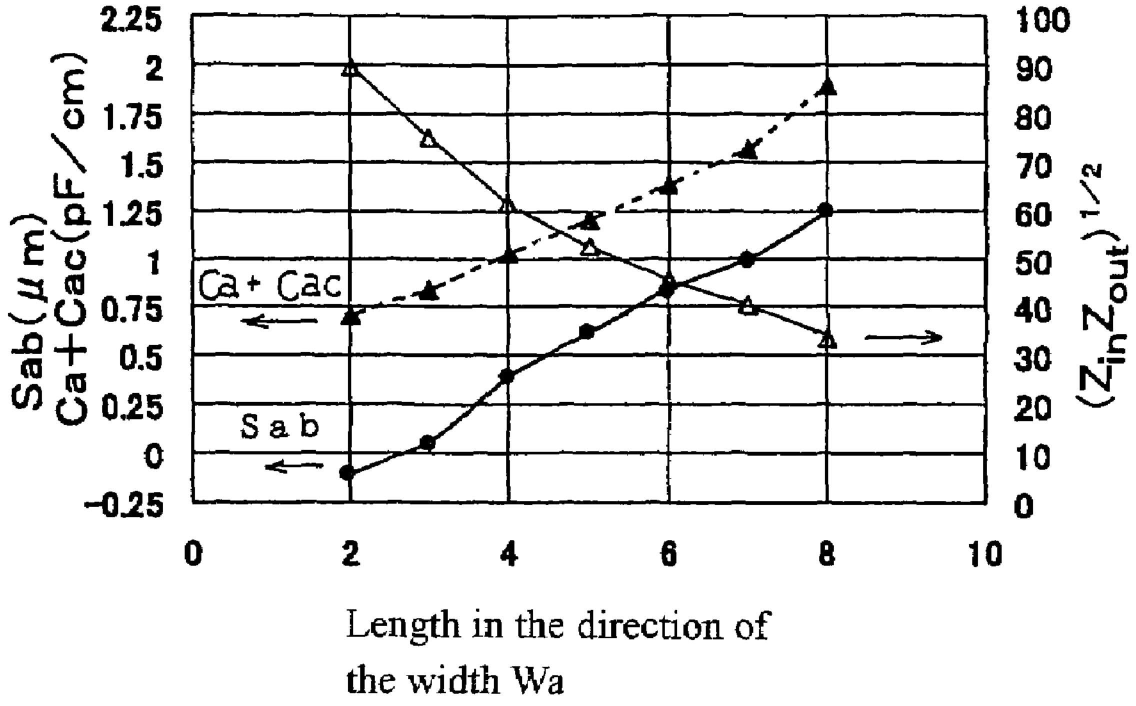
FIG. 5 is a graph diagram that shows how the values for the distance Sab, capacitance (Ca+Cac), and input/output impedance $(Z_{in}\times Z_{out})^{1/2}$ will be changed to satisfy the condition of Ca=Cab as the length of each respective one of the second line and third line in the direction of the width is varied.
Figure 6:
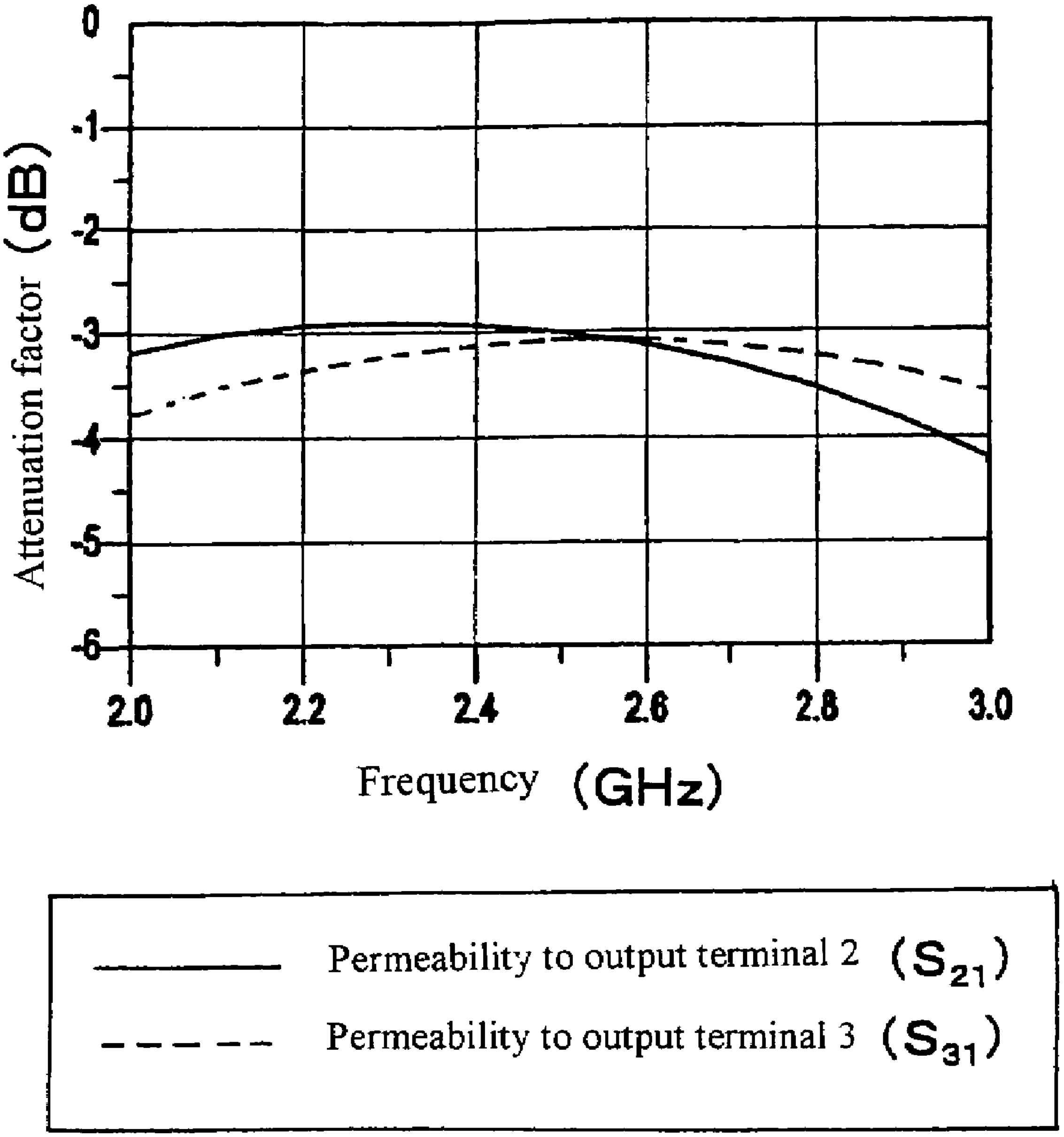
FIG. 6 is a graph diagram that shows the transmission characteristic to the output terminal 2 ($S_{21}$) and the transmission characteristic to the output terminal 3 ($S_{31}$)
Figure 7:
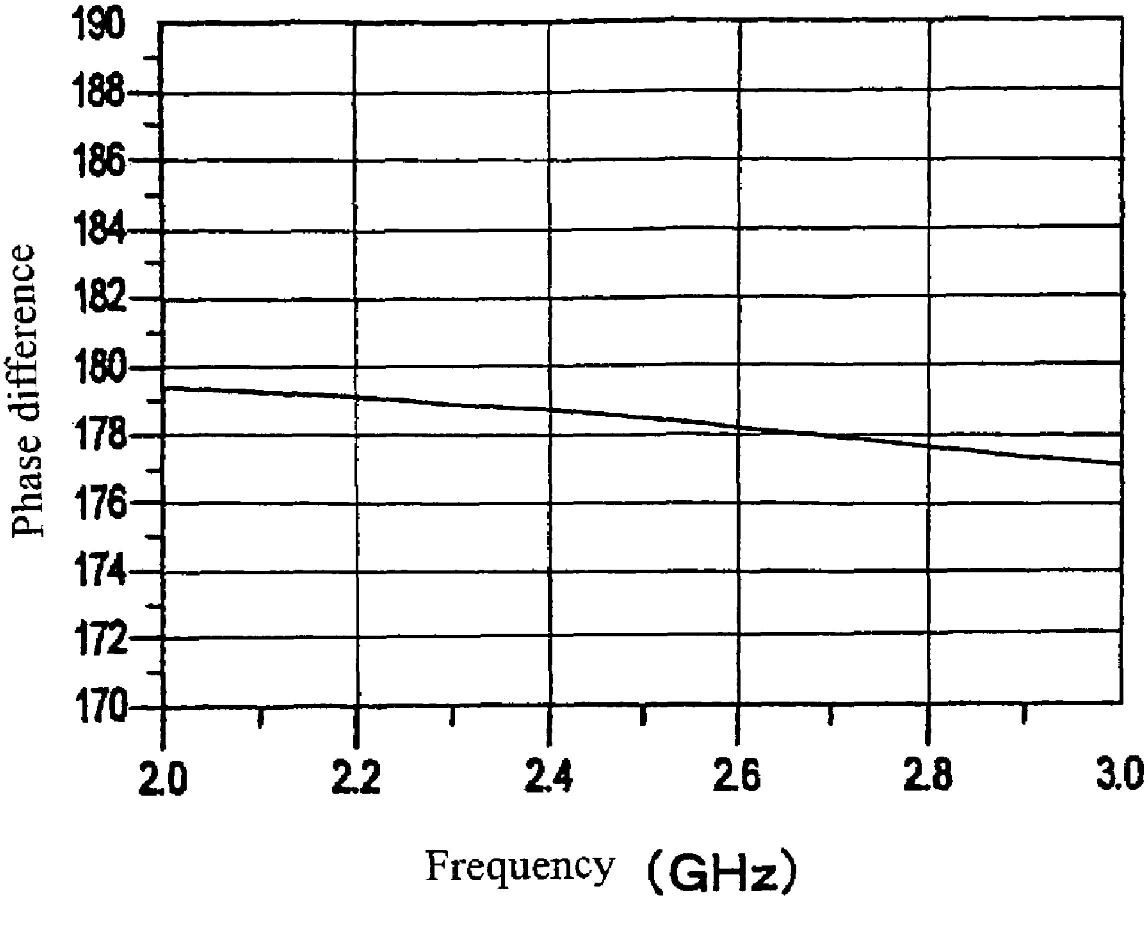
FIG. 7 is a graph diagram that shows the phase difference between the output terminal 2 and output terminal 3 when a signal is provided through the input terminal 1.
Figure 8:
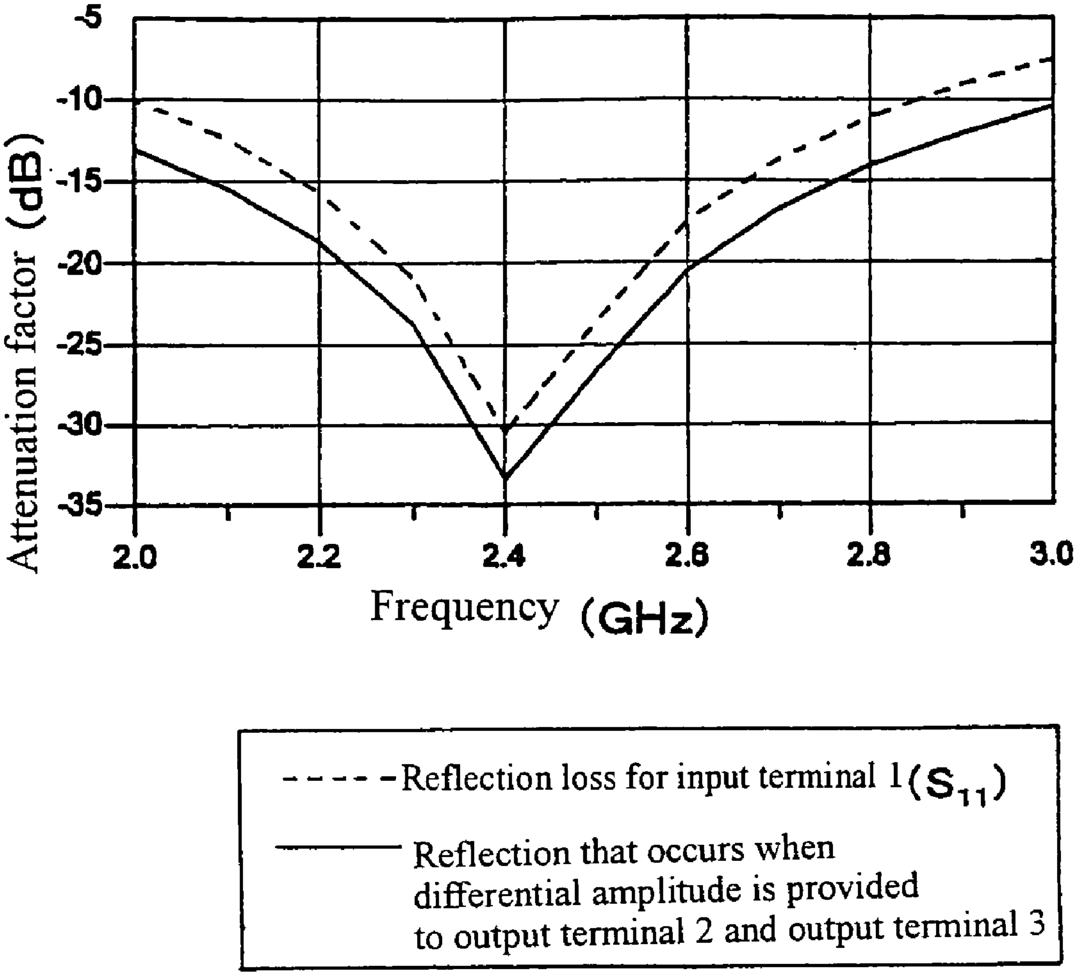
FIG. 8 is a graph diagram that shows the variation of the reflection loss for the input terminal 1 ($S_{11}$) as well as the variation of the reflection that occurs when differential amplitude is provided to the output terminal 2 and output terminal 3.

The results that have been obtained by the electromagnetic field simulation are shown in FIGS. 6 through 8.

FIG. 6 is a graph diagram that shows the transmission characteristic for the balanced terminal or output terminal 2 ($S_{21}$) and the transmission characteristic for the balanced terminal or output terminal 3 ($S_{31}$) when a signal is provided through the unbalanced terminal or input terminal 1. It may be seen from FIG. 6 that the amplitude is almost equal for the band of 2.45 GHz.

FIG. 7 is a graph diagram that shows the phase difference between the output terminal 2 and output terminal 3 when a signal is provided through the input terminal 1. It may be seen from FIG. 7 that the phase that can occur is of substantially 180 degrees and the phase shift can be reduced significantly.

FIG. 8 shows the reflection factor for the input terminal 1 ($S_{11}$) as well as the reflection that occurs when differential amplitude is provided at the output terminal 2 and output terminal 3 ($(S_{22}+S_{23}-2\times S_{23})/2^{3/2}$, where $S_{22}$ represents the reflection factor for the output terminal 2 and $S_{23}$ represents the transmission factor from the output terminal 3 to the output terminal 2). It may be seen from FIG. 8 that less than 25 dB is provided at 2.45 GHz and the desired output impedance can be obtained.

POSSIBLE INDUSTRIAL UTILITIES

It may be appreciated from the foregoing description that the balun according to the present invention provides the performance that is equivalent to the commercially available chip components, and permits the phase shift to be reduced significantly. Thus, the balun can be incorporated in the multi-layer circuit board, and can flexibly meet the requirements for producing many kinds of components as well as the short-term production requirements. The balun can also meet the requirements for producing the drastically reduced size components.

The invention claimed is:

1. A balun having three lines, including a first line, a second line and a third line, arranged in parallel with the ground surface, wherein said second line and said third line are arranged at the same height from the ground surface, the longitudinal length of each respective one of said first line, said second line and said third line is specified to be equal to a quarter of the wavelength at the central frequency in the working band, and the capacitance between said second line and the ground surface is specified to be equal to the capacitance between said second line and said first line.

2. The balun as defined in claim 1, wherein the distance between the center of each respective one of said second line and said third line in the direction of the height is specified to be longer than the distance between the center of said first line in the direction of the height and the center of each respective one of said second line and said third line in the direction of the height.

3. The balun as defined in claim 1, wherein the permittivity of a dielectric between the plane formed by the center of each respective one of said second line and said third line in the direction of the height and the ground surface located closer to each respective one of said second line and said third line is specified to be less than the permittivity of a dielectric between the plane formed by the center of said first line in the direction of the height and the plane formed by the center of each respective one of said second line and said third line in the direction of the height.

4. The balun as defined in claim 1, wherein the length of each respective one of said second line and said third line in the direction of the width is specified to be equal, said second line and said third line are arranged symmetrically with regard to the plane formed by the center of said first line in the direction of the width, one terminal of said first line being assumed as an input terminal for unbalanced-mode signals is connected to one terminal of said third line as said input terminal for unbalanced-mode signals, the other terminal of said first line and one terminal of said second line are connected to the ground surface respectively, and the other terminal of said second line and the other terminal of said third line are assumed as output terminals for balanced-mode signal, the impedance of said input terminal for unbalanced-mode signals and the impedance of said each output terminal for balance signals being specified to satisfy the following relationship defined below:

$$(Ca+Cac)/\epsilon_0=\epsilon_r^{1/2}\times Z_{air}/(Z_{in}\times Z_{out})^{1/2}$$

where Ca is the capacitance (C) between said second line and the ground surface, Cac is the capacitance (C) between said second line and said third line, $\epsilon_0$ is the permittivity in the vacuum, $\epsilon_r$ is the relative permittivity, $Z_{air}$ is the characteristic impedance (Ω) in the vacuum, $Z_{in}$ is the impedance (Ω) of said input terminal for unbalanced-mode signals, and $Z_{out}$ is the impedance (Ω) of said output terminal for balanced-mode signals.

5. The balun as defined in claim 2, wherein the length of each respective one of said second line and said third line in the direction of the width is specified to be equal, said second line and said third line are arranged symmetrically with regard to the plane formed by the center of said first line in the direction of the width, one terminal of said first line being assumed as an input terminal for unbalanced-mode signals is connected to one terminal of said third line as said input terminal for unbalanced-mode signals, the other terminal of said first line and one terminal of said second line are connected to the ground surface respectively, and the other terminal of said second line and the other terminal of said third line are assumed as output terminals for balanced-mode signal, the impedance of said input terminal for unbalanced-mode signals and the impedance of said each output terminal for balance signals being specified to satisfy the following relationship defined below:

$$(Ca+Cac)/\epsilon_0=\epsilon_r^{1/2}\times Z_{air}/(Z_{in}\times Z_{out})^{1/2}$$

where Ca is the capacitance (C) between said second line and the ground surface, Cac is the capacitance (C) between said second line and said third line, so is the permittivity in the vacuum, $\epsilon_r$ is the relative permittivity, $Z_{air}$ is the characteristic impedance (Ω) in the vacuum, $Z_{in}$ is the impedance (Ω) of said input terminal for unbalanced-mode signals, and $Z_{out}$ is the impedance (Ω) of said output terminal for balanced-mode signals.

6. The balun as defined in claim 3, wherein the length of each respective one of said second line and said third line in the direction of the width is specified to be equal, said second line and said third line are arranged symmetrically with regard to the plane formed by the center of said first line in the direction of the width, one terminal of said first line being assumed as an input terminal for unbalanced-mode signals is connected to one terminal of said third line as said input terminal for unbalanced-mode signals, the other terminal of said first line and one terminal of said second line are connected to the ground surface respectively, and the other terminal of said second line and the other terminal of said third line are assumed as output terminals for balanced-mode signal, the impedance of said input terminal for unbalanced-mode signals and the impedance of said each output terminal for balance signals being specified to satisfy the following relationship defined below:

$$(Ca+Cac)/\epsilon_0=\epsilon_r^{1/2}\times Z_{air}/(Z_{in}\times Z_{out})^{1/2}$$

where Ca is the capacitance (C) between said second line and the ground surface, Cac is the capacitance (C) between said second line and said third line, so is the permittivity in the vacuum, $\epsilon_r$ is the relative permittivity, $Z_{air}$ is the characteristic impedance (Ω) in the vacuum, $Z_{in}$ is the impedance (Ω) of said input terminal for unbalanced-mode signals, and $Z_{out}$ is the impedance (Ω) of said output terminal for balanced-mode signals.

* * * * *